(12) United States Patent
Fujita

(10) Patent No.: US 7,528,327 B2
(45) Date of Patent: May 5, 2009

(54) INSPECTION METHOD AND SEMICONDUCTOR DEVICE

(75) Inventor: Masashi Fujita, Tokyo (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 11/411,759

(22) Filed: Apr. 25, 2006

(65) Prior Publication Data
US 2006/0244463 A1      Nov. 2, 2006

(30) Foreign Application Priority Data
Apr. 28, 2005   (JP)   ............................. 2005-133494

(51) Int. Cl.
   *H05K 1/16*   (2006.01)
(52) U.S. Cl. ...................... 174/260; 174/254
(58) Field of Classification Search ............... 174/254, 174/260, 261
   See application file for complete search history.

(56) References Cited

U.S. PATENT DOCUMENTS 6,111,424 A * 8/2000 Bosacchi ................... 324/770
6,613,599 B2 * 9/2003 Imaeda ..................... 438/30
6,657,606 B2 * 12/2003 Kang et al. ................. 345/87
6,760,091 B2 * 7/2004 Uehara ...................... 349/152
6,781,403 B2 * 8/2004 Kim ......................... 324/770
6,972,573 B2 * 12/2005 Ishioka et al. .............. 324/523

FOREIGN PATENT DOCUMENTS

JP    2004-095872    3/2004
JP    2005-069945    3/2005

* cited by examiner

Primary Examiner—Ishwar (I. B.) Patel
(74) Attorney, Agent, or Firm—Cook Alex Ltd.

(57) ABSTRACT

It is an object to provide an inspection method to enable simple and easy inspection of the electrical connecting state between a connecting terminal of a semiconductor integrated circuit over a substrate such as a glass substrate or a plastic substrate and a crimp connecting terminal of a flexible printed circuit. A crimp inspection terminal is provided to a flexible printed circuit so as to inspect all connecting terminals of the semiconductor integrated circuit over the substrate. A crimp connecting terminal and a crimp inspection terminal are connected with one connecting terminal of the semiconductor integrated circuit by thermocompression. By such a configuration, the inspection of the electrical connecting state between the connecting terminal and the crimp inspection terminal, in the other words, the inspection of conducting state can be performed by using only an external connecting terminal of the flexible printed circuit through the crimp inspection terminal.

24 Claims, 7 Drawing Sheets

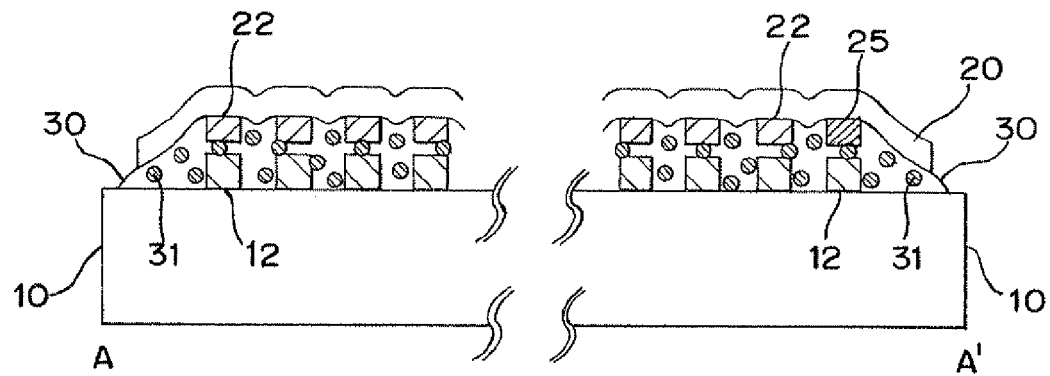
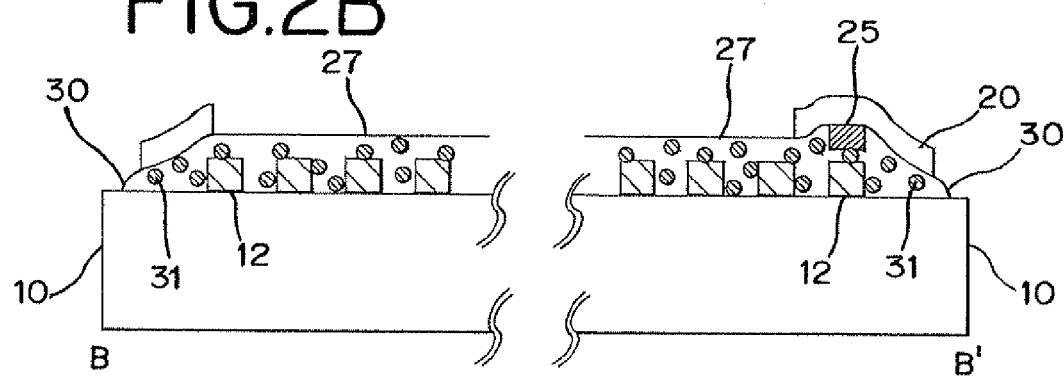
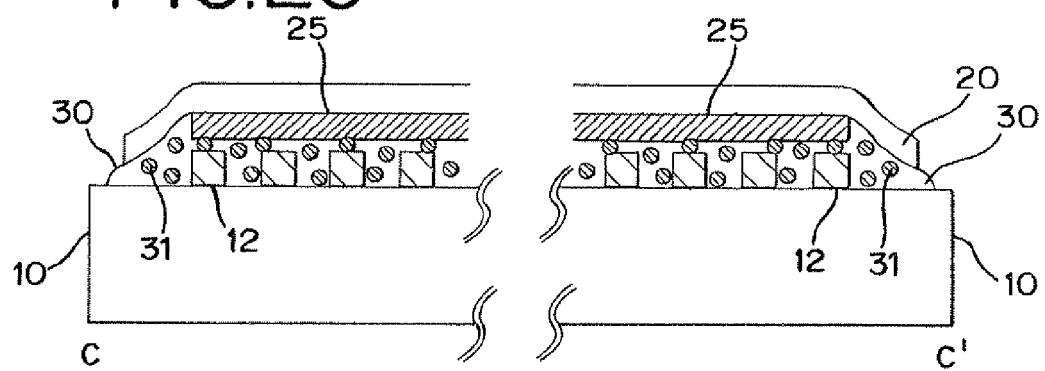

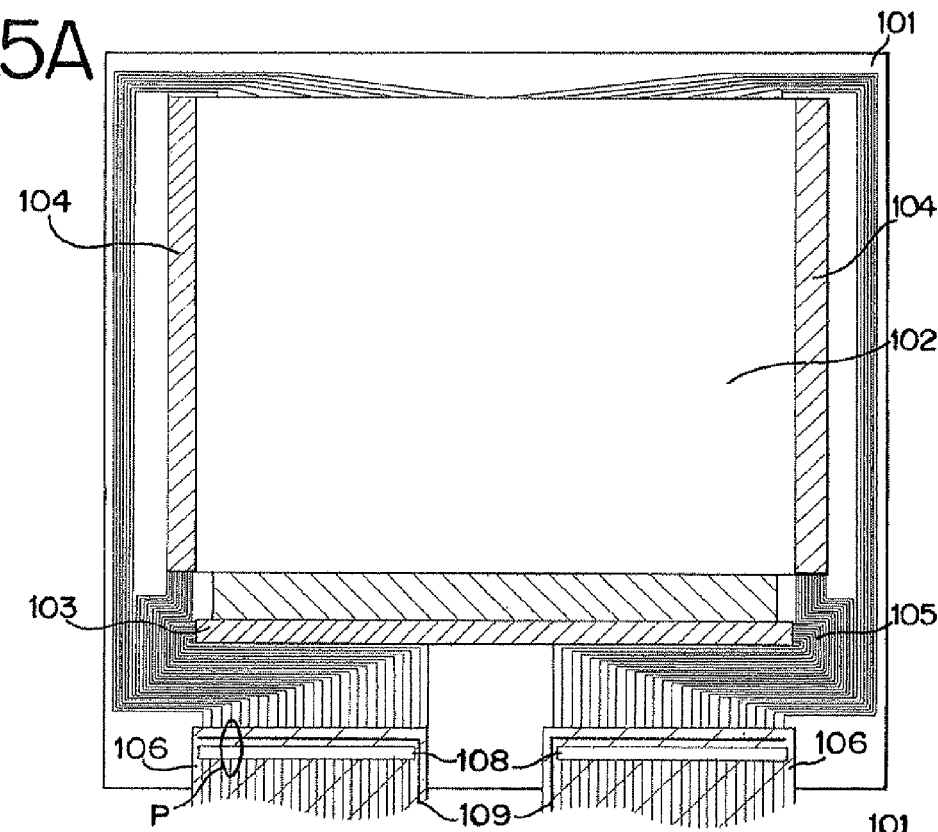
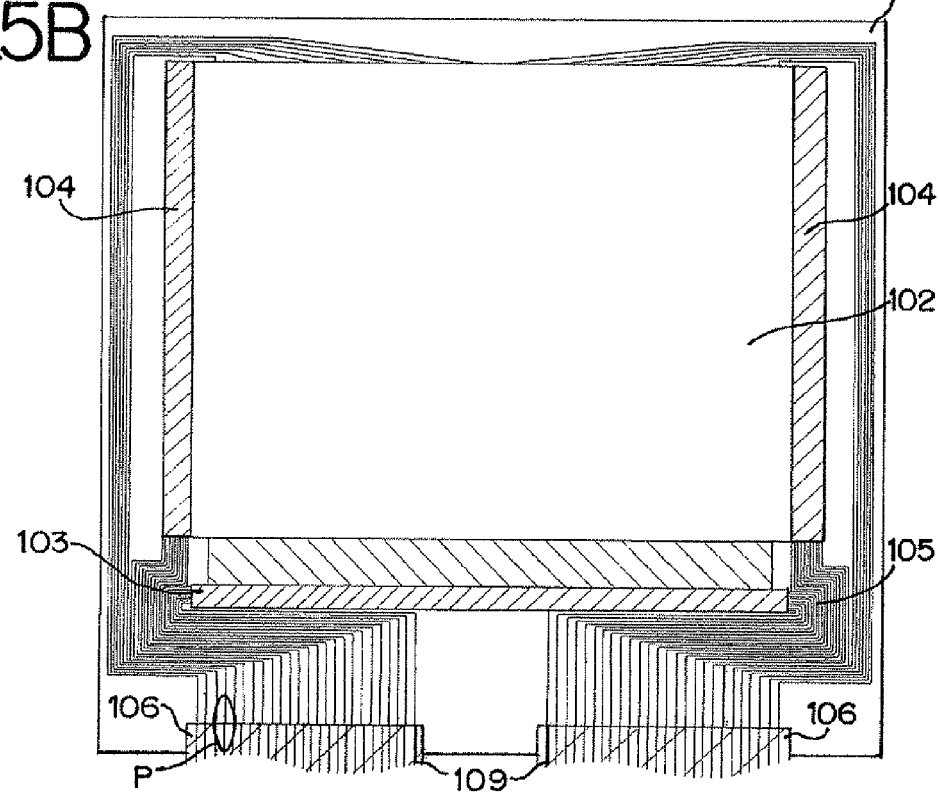

INSPECTION METHOD AND SEMICONDUCTOR DEVICE

BACKGROUND OF THE INVENTION

1. Field of the Invention

The present invention relates to an inspection method to enable a simple and easy inspection of an electrical connecting state between a connecting terminal of a semiconductor integrated circuit formed over a substrate and a connecting terminal of a FPC (Flexible Printed Circuit), and an inspection of an electrical connecting state between all terminals.

2. Description of the Related Art

In recent years, since a thin panel has low power consumption, a small size, and a light weight, the thin panel is incorporated into various electronic equipment and products. The thin panel has a semiconductor integrated circuit formed over a substrate such as a glass substrate or a plastic substrate. The semiconductor integrated circuit has to be connected with an external device, and a flexible printed circuit is usually used for the connection. Connection using a flexible printed circuit has advantages in that miniaturization, reduction in weight, and a three-dimensional wiring are possible.

Electrical connection of a connecting terminal of a semiconductor integrated circuit formed over a substrate and a crimp connecting terminal of a flexible printed circuit is performed by thermocompression using an anisotropic conductive film having an adhesive and a conductive particle. Thermocompression is the connection by heating treatment and pressurization treatment, here. When pressure is unevenly applied to a connected portion in the process of thermocompression, the flexible printed circuit is out of alignment and poor connection is sometimes occurred between the connecting terminal and the crimp connecting terminal. Therefore, it is necessary to inspect the electrical connecting state between the connecting terminal and the crimp connecting terminal. An inspection of the electrical connecting state can be performed by measuring a resistance value between the connecting terminals.

However, since the semiconductor integrated circuit is minute and a thin film, it is highly possible that wires are cut when connecting a terminal of an inspection device to the semiconductor integrated circuit over the substrate. Furthermore, when the substrate is a plastic substrate, a terminal of the inspection device cannot be fixed since the plastic substrate is soft.

As a conventional inspection method, there is a method in which a pad or a wire for the inspection is arranged over a substrate or an external device (for example, see Patent Documents 1 and 2).

[Patent Document 1]
  Japanese Patent Laid-Open No. 2004-95872

[Patent Document 2]
  Japanese Patent Laid-Open No. 2005-69945

It has been difficult to inspect the electrical connecting state between all terminals in the conventional inspection method which arranges a wire or a pad for inspection over a substrate or in an external device. For example, in the inspection method disclosed in Patent Document 1, an exclusive wire for inspecting the electrical connecting state between terminals is arranged besides a wire which is necessary for a circuit. Then, the exclusive wire is connected with a wire or a pad for inspection, and the inspection is performed only to see the electrical connecting state between the terminals. Here, when a wire which is necessary for the circuit and a wire or a pad for inspection are connected, electrical connection between the terminals can be inspected. However, in this case, when the circuit is operated, the wire or the pad for inspection becomes an obstacle. Therefore, it is necessary to cut the wire by using a device such as a laser cutter.

In addition, when a liquid crystal display panel is considered as an example of a thin panel, it is difficult to arrange a mensurative probe in a connecting terminal formed over the substrate after filling a liquid crystal material. Therefore, it has been necessary to inspect the connecting state by displaying a panel after filling the liquid crystal material. Needless to say, in thin panels other than the liquid crystal display panel, it is also difficult to arrange a mensurative probe in a connecting terminal formed over a substrate in the same manner after sealing by a counter substrate or after forming a protective film or the like to inspect the connection state.

BRIEF SUMMARY OF THE INVENTION

Thus, it is an object of the present invention to provide an inspection method to enable a simple and easy an inspection of the electrical connecting state between a connecting terminal of a semiconductor integrated circuit over a substrate such as a glass substrate or a plastic substrate and a crimp connecting terminal of a flexible printed circuit.

The present invention provides a particular shape and a connection condition of a flexible printed circuit to solve the problem and to accomplish the above object. The particular shape and the connection condition can be provided by forming a crimp inspection terminal in a flexible printed circuit in order to inspect all connecting terminals of the semiconductor integrated circuit over the substrate. Both of a crimp connecting terminal and a crimp inspection terminal are connected with one connecting terminal of the semiconductor integrated circuit by thermocompression. By such a configuration, the electrical connecting state between the connecting terminal of the semiconductor integrated circuit and the crimp connecting terminal, in the other words, the inspection of conducting state can be performed by using only an external connecting terminal of the flexible printed circuit through the crimp inspection terminal.

The crimp connecting terminal and the crimp inspection terminal can be formed by patterning a conductive film. In other words, the crimp connecting terminal and the crimp inspection terminal are the terminals having different functions, and can be formed from the same material.

In addition, according to an aspect of the present invention, a connecting state can be inspected after a semiconductor integrated circuit is formed and the circuit is covered with a protection film, or after an EL (Electro Luminescense) display panel or a liquid crystal display panel is sealed with a counter substrate. First, a thermocompression process is performed for connecting a flexible printed circuit with the circuit or the panel. Afterwards, an inspection of the semiconductor integrated circuit is performed. In this inspection, the semiconductor integrated circuit is actually operated or the display panel is really displayed through a circuit inspection, and an electrical connecting state of all connecting terminals is checked. However, when a defect is found at the time of the circuit inspection, it is difficult to determine whether it is a circuit defect or a connection defect with the flexible printed circuit. Though, when the inspection method of the present invention is used, the inspection of the connecting terminal can be performed without operating the circuit or displaying the display panel. This is because, the crimp inspection terminal is provided in the flexible printed circuit so that all connecting terminals of the semiconductor integrated circuit over the substrate are inspected, and the connecting state can be inspected by the crimp inspection terminal. As a result of such an inspection of the present invention, when a connecting defect is found, the defect can be repaired immediately, which can improve the efficiency of the circuit inspection.

A specific configuration of the present invention is shown hereinafter.

One aspect of the present invention is an inspection method in which a conducting state between a connecting terminal provided in a semiconductor integrated circuit and a crimp connecting terminal provided in a flexible printed circuit is inspected by a crimp inspection terminal which is provided in the flexible printed circuit and connected with the connecting terminal.

Another aspect of the invention is an inspection method in which a connecting terminal provided in a semiconductor integrated circuit is connected with a crimp connecting terminal provided in a flexible printed circuit through an anisotropic conductive film, and the conducting state between the connecting terminal and the crimp connecting terminal is inspected by a crimp inspection terminal which is provided in the flexible printed circuit and connected with the connecting terminal.

Another aspect of the present invention is an inspection method in which a conducting state between one of a plurality of connecting terminals provided in a semiconductor integrated circuit and a crimp connecting terminal provided in a flexible printed circuit is inspected by one crimp inspection terminal which is provided in the flexible printed circuit and connected with the plurality of connecting terminals.

Another aspect of the present invention is an inspection method in which a conducting state between a connecting terminal provided in a semiconductor integrated circuit and a crimp connecting terminal provided in a flexible printed circuit is inspected by a crimp inspection terminal which is provided in the flexible printed circuit and connected with the connecting terminal, and after the inspection, a portion of the crimp inspection terminal of the flexible printed circuit is separated to cut the connection between the connecting terminal and the crimp inspection terminal.

Another aspect of the present invention is an inspection method in which a conducting state between a connecting terminal provided in a semiconductor integrated circuit and a crimp connecting terminal provided in a flexible printed circuit is inspected by a crimp inspection terminal which is provided in the flexible printed circuit and connected with the connecting terminal in a state of the semiconductor integrated circuit is sealed.

Another aspect of the present invention is an inspection method in which electrical connection between a semiconductor integrated circuit and a flexible printed circuit is inspected. The semiconductor integrated circuit has a plurality of connecting terminals, the flexible printed circuit has the same number of wires as the connecting terminals and an inspection wire, a portion of each of the wires functions as the crimp connecting terminal, while another portion of each of the wires functions as a first external connecting terminal, a portion of the inspection wire functions as a crimp inspection terminal, while another portion of the inspection wire functions as a second external connecting terminal, each of the plurality of connecting terminals is connected with corresponding wire through corresponding crimp connecting terminal, the plurality of connecting terminals are connected with the inspection wire through corresponding crimp inspection terminal, the connecting state between the connecting terminal and the crimp connecting terminal is inspected by measuring a resistance value between the first external connecting terminal and the second external connecting terminal, and after the inspection, a portion of the crimp inspection terminal of the flexible printed circuit is separated to cut the connection between the connecting terminal and the crimp inspection terminal.

Another aspect of the present invention is a semiconductor device which has a semiconductor integrated circuit which provides with a connection terminal, a flexible printed circuit which has a crimp connecting terminal connected with the connecting terminal, and an external circuit connected with the semiconductor integrated circuit through the crimp connecting terminal. The flexible printed circuit has an opening portion, and a portion of the crimp inspection terminal of the flexible printed circuit is separated at the opening portion.

Another aspect of the present invention is a semiconductor device which has a semiconductor integrated circuit which provides with a connection terminal, a flexible printed circuit which has a crimp connecting terminal connected with the connecting terminal and a crimp inspection terminal, and an external circuit connected with the semiconductor integrated circuit through the crimp connecting terminal. The flexible printed circuit has an opening portion, and a portion of the crimp inspection terminal of the flexible printed circuit is separated at the opening portion so that the connection between the connecting terminal and the crimp inspection terminal is cut.

Another aspect of the present invention is a semiconductor device which has a semiconductor integrated circuit which provides with a connection terminal, a flexible printed circuit which has a crimp connecting terminal connected with the connecting terminal and a crimp inspection terminal, and an external circuit connected with the semiconductor integrated circuit through the crimp connecting terminal. The crimp inspection terminal is provided in an inspection wire having the crimp connecting terminal. The flexible printed circuit has an opening portion in a thermocompression region provided for connecting the connecting terminal and the crimp connecting terminal, and a portion of crimp inspection terminal of the flexible printed circuit is separated at the opening portion.

Another aspect of the present invention is a semiconductor device which has a semiconductor integrated circuit which provides with a connection terminal, a flexible printed circuit which has a crimp connecting terminal connected with the connecting terminal and a crimp inspection terminal, and an external circuit connected with the semiconductor integrated circuit through the crimp connecting terminal. The crimp inspection terminal is provided in an inspection wire having the crimp connecting terminal. The flexible printed circuit has an opening portion in a thermocompression region provided for connecting the connecting terminal and the crimp connecting terminal, and a portion of crimp inspection terminal of the flexible printed circuit is separated at the opening portion so that the connection between the connecting terminal and the crimp inspection terminal is cut.

Another aspect of the present invention is a semiconductor device having a semiconductor integrated circuit and a flexible printed circuit, in which a semiconductor integrated circuit has a plurality of connecting terminals, a flexible printed circuit has the same number of wires as the connecting terminals and an inspection wire, a portion of the wire functions as a crimp inspection terminal, while another portion of each of the wires functions as a first external connecting terminal, a portion of the inspection wire functions as a crimp inspection terminal, while another portion of the inspection wire functions as a second external connecting terminal; each of the plurality of connecting terminals is connected with the corresponding wire through corresponding crimp connecting terminal, the plurality of connecting terminals are connected with the inspection wire through corresponding crimp inspection terminal, a flexible printed circuit has a opening portion in one region between the crimp connecting terminal and the crimp inspection terminal; and a portion of crimp inspection terminal of the flexible printed circuit is separated at the opening portion so that the connection between the connecting terminal and the crimp inspection terminal is cut.

The present invention can provide a new inspection method using a particular shape and a particular connection condition of a flexible printed circuit. According to the inspection method of the present invention, an electrical connecting state between a connecting terminal of a semiconductor integrated circuit over a substrate and a crimp connecting terminal of a flexible printed circuit can be inspected simply and easily. In addition, according to the inspection method of the present invention, an electrical connecting state between all of terminals can be inspected. In particular, the inspection of the present invention in which a flexible printed circuit is removed without using a laser cutting device or the like can be finished in a short time.

BRIEF DESCRIPTION OF THE DRAWING

FIGS. 2A to 2C are sectional views taken along lines A-A', B-B', and C-C' of FIG. 1 respectively;

FIGS. 5A and 5B are top views each showing a display panel manufactured by using the inspection method of the present invention;

DETAILED DESCRIPTION OF THE INVENTION

Figure 1:
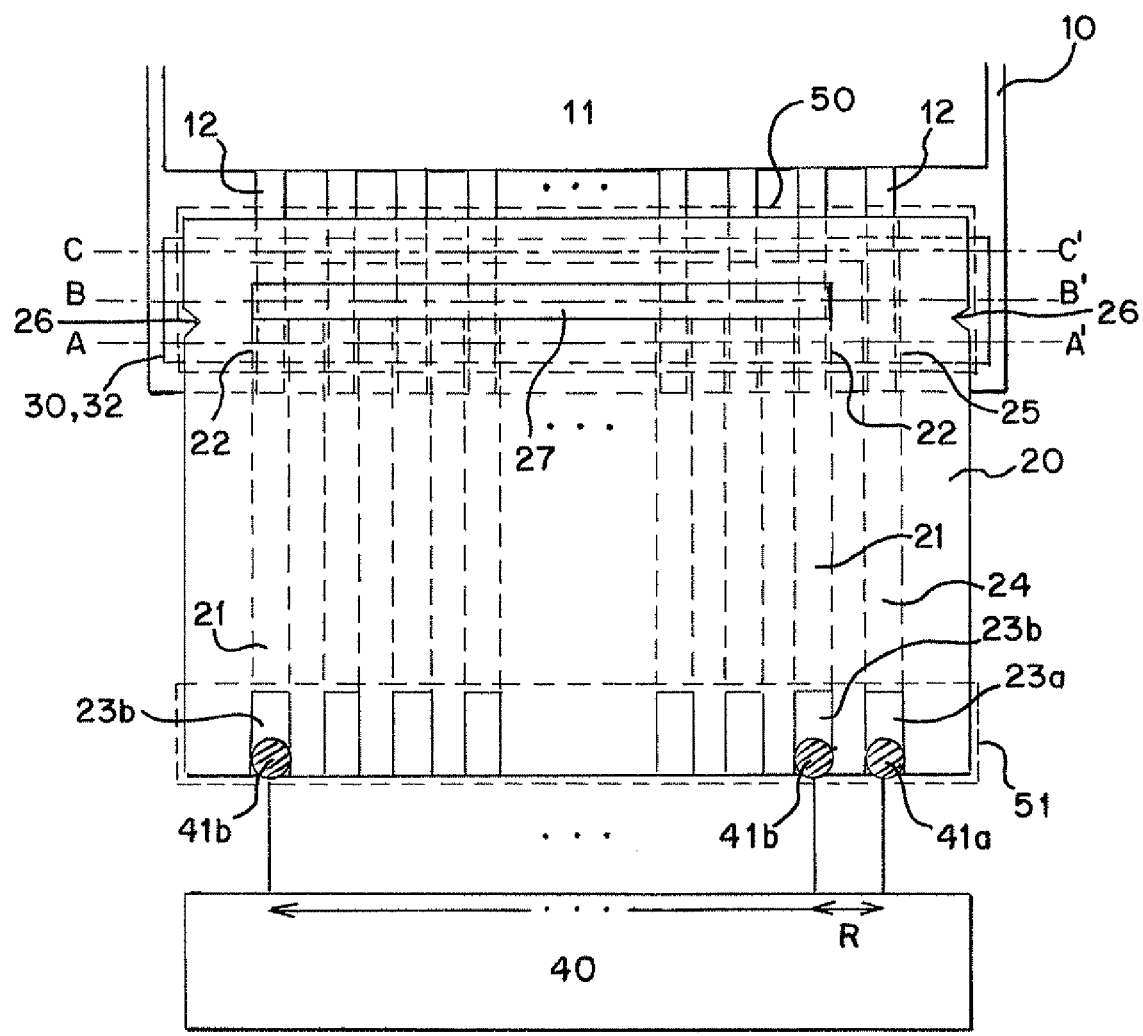
FIG. 1 is a top view showing a configuration of a connecting terminal of the present invention.

Embodiment modes of the present invention are hereinafter described in detail with reference to the drawings. However, the present invention can be performed in various different ways, and it is to be understood by those skilled in the art that the mode and detail of the present invention can be changed variously within the scope of the present invention. Therefore, the present invention should not be construed as being limited to the description of the following embodiment modes. Note that, the same reference numeral is given to the same portion or a portion having a similar function among drawings for showing embodiment modes, and repetitive description is omitted.

EMBODIMENT MODE 1

This embodiment mode describes an example in which a connecting terminal of a semiconductor integrated device formed over a substrate such as a glass substrate or a plastic substrate and a crimp connecting terminal of a flexible printed circuit are connected by thermocompression using an anisotropic conductive film.

FIG. 1 shows a terminal area in which connecting terminals 12 of a semiconductor integrated circuit 11 formed over a substrate 10 such as a glass substrate or a plastic substrate and crimp connecting terminals 22 of a flexible printed circuit 20 are connected by thermocompression using an anisotropic conductive film 30. FIGS. 2A to 2C are sectional views taken along lines A-A', B-B', and C-C' of FIG. 1 respectively. Note that, although it is preferable to form a base film such as an insulating film over the substrate 10, it is not specifically shown in the drawings.

A plastic substrate is a substrate having flexibility. For example, plastic includes polynorbornene having a polar radical, polyethylene terephthalate (PET), polyether sulfone (PES), polyethylene naphthalate (PEN), polycarbonate (PC), nylon, polyether etherketone (PEEK), polysulfone (PSF), polyether imide (PEI), polyarylate (PAR), polybutylene terephthalate (PBT), polyimide or the like.

In FIG. 1, the semiconductor integrated circuit 11 is formed over the substrate 10. The semiconductor integrated circuit is a circuit having a certain function. For example, it includes a pixel circuit or a driver circuit provided in an EL display panel or a liquid crystal display panel; a demodulation circuit, a modulation circuit, or a power generating circuit for a wireless chip (also referred to as an RFID tag (Radio Frequency Identification), an ID tag, an ID chip, an IC tag, an IC chip, an RF tag (Radio Frequency), an RF chip, a wireless tag, an electronic tag, or an electronic chip); a control arithmetic circuit; a memory; or the like.

Furthermore, in a portion of a region over the substrate 10, a plurality of connecting terminals 12 are formed with a metal for connecting the semiconductor integrated circuit 11 with the external portion. The metal may be used any of titanium (Ti), aluminum (Al), gold (Au), platinum (Pt), nickel (Ni), tungsten (W), chromium (Cr), molybdenum (Mo), iron (Fe), cobalt (Co), copper (Cu), palladium (Pd), or the like.

Meanwhile, a portion of the flexible printed circuit 20 is arranged over the connecting terminals 12 so as to overlap with a portion of the connecting terminals 12. The flexible printed circuit 20 has the same number of wires 21 as the connecting terminals 12 in order to connect the semiconductor integrated circuit 11 with a device provided with an external circuit (referred to an external device). Each of wires 21 can be functionally divided into the crimp connecting terminal 22 which is a portion connected with the connecting terminal 12 and an external connecting terminal 23b which is a portion connected with the external device.

Here, the flexible printed circuit 20 has at least one inspection wire 24 besides the wires 21. Unlike the wires 21, the inspection wire 24 has a crimp inspection terminal 25 instead of the crimp connecting terminal 22. Although the crimp connecting terminal 22 and the crimp inspection terminal 25 have different functions; however, they can be formed with the same metal. The crimp inspection terminal 25 is longer than the crimp connecting terminal 22, and is bent at a right angle between the crimp connecting terminal 22 and the semiconductor integrated circuit 11. The crimp inspection terminal 25 has a shape to step over the connecting terminals 12 perpendicularly in order to be electrically connected with all the connecting terminals 12. In addition, the region where the crimp inspection terminal 25 is formed is on the anisotropic conductive film 30 and located on the side closer to the semiconductor integrated circuit 11 to determine the connecting state between the connecting terminals by measuring a resistance value. Note that the crimp inspection terminal is not limited to the shape shown in FIG. 1. In other words, the shape of the crimp inspection terminal is not limited as long as the crimp inspection terminal is provided in the region where all of the connecting terminals 12 are electrically connected with the crimp inspection terminal and the connecting state between the connecting terminals can be inspected by measuring a resistance value.

The flexible printed circuit as shown in this embodiment mode has a structure in which a wire layer is sandwiched between insulating layers. In a region 50 where the crimp connecting terminals 22 and the crimp inspection terminal 25 are provided, the flexible printed circuit does not have an insulating layer on its back side (the side of the substrate 10). According to this configuration, the crimp connecting terminals 22 and the crimp inspection terminal 25 are exposed to a back side. Meanwhile, in a region 51 where an external connecting terminal 23a and external connecting terminals 23b are provided, the flexible printed circuit 20 does not have an insulating layer on its front side. According to this configuration, the external connecting terminal 23a and the external connecting terminals 23b are exposed to a front side. In addition, the region where the wires 21 and the inspection wire 24 are sandwiched between insulating layers corresponds to the region except for the region 50 and the region 51. The structure of the flexible printed circuit is not limited to this structure. The anisotropic conductive layer 30 which functions to connect the connecting terminals 12 with the crimp connecting terminals 22 is provided between the connecting terminals 12 and the crimp connecting terminals 22. Note that the inspection method of the present invention is not limited to the configuration in which the anisotropic conductive film is used for connection.

A region in which the anisotropic conductive layer 30 is arranged corresponds to a thermocompression region 32 to which thermocompression is performed. After sandwiching the anisotropic conductive film 30 between the substrate 10 and the flexible printed circuit 20 with the condition that the substrate 10 is positioned on the bottom side, thermocompression can be performed by applying both heat and pressure thereto at the same time. In other words, thermocompression is performed to the thermocompression region 32 by applying heat and pressure at the same time from an upper side of the flexible printed circuit 20. Note that the reason that the substrate 10 is arranged below is that the substrate 10 is harder and larger than the flexible printed circuit 20; however, the present invention is not limited to this.

The crimp connecting terminals 22 and the crimp inspection terminal 25 are connected with the connecting terminals 12 respectively by thermocompression. In addition, the thermocompression region 32 is in the region where the crimp connecting terminals 22 and the crimp inspection terminal 25 are connected with the each connecting terminals 12 respectively.

FIGS. 2A to 2C show sectional views taken along lines A-A', B-B', and C-C' of FIG. 1 after thermocompression respectively.

FIG. 2A shows a state in which a plurality of connecting terminals 12 for connecting the external device with the semiconductor integrated circuit are formed over the substrate 10. The anisotropic conductive film 30 is formed over the connecting terminals 12, and the flexible printed circuit 20 is arranged thereover. A plurality of the crimp connecting terminals 22 and at least one crimp inspection terminal 25 are formed so as to make a pair with each connecting terminal 12 on the side of the substrate 10 of the flexible printed circuit 20. The anisotropic conductive film 30 has a conductive particle 31 having a function to electrically connect the connecting terminal 12 with the crimp connecting terminal 22 or the crimp inspection terminal 25, and also has an adhesive to maintain the connecting state physically. An acrylic resin, an epoxy resin, or an olefin resin can be used as the adhesive.

FIG. 2B is different from FIG. 2A in that the flexible printed circuit 20 is not provided in some region and the crimp connecting terminal 22 which makes a pair with the connecting terminal 12 is not provided. Since the other configuration is similar to FIG. 2A, the description thereon is omitted.

FIG. 2C is different from FIG. 2A in that the crimp connecting terminal 22 which makes a pair with the connecting terminal 12 is not provided, and the crimp inspection terminal 25 is provided over the all of the connecting terminals 12. Since the other configuration is similar to FIG. 2A, the description thereon is omitted.

After thermocompression, the electrical connecting state between the connecting terminal 12 and the crimp connecting terminal 22 is inspected. The electrical connecting state in the inspection can be determined to be a good state or a bad state by measuring a resistance value between the connecting terminal 12 and the crimp connecting terminal 22.

First, as the inspection setup, a terminal 41a of an inspection device 40 is fixed to the external connecting terminal 23a of the inspection wire 24, and another terminal 41b is connected with the external connecting terminal 23b which is connected with the connecting terminal 12 and the crimp connecting terminal 22 (see FIG. 1). The external connecting terminals 23a and 23b are wide in comparison with the connecting terminal 12 and the crimp connecting terminal 22. In addition, the external connecting terminals 23a and 23b may be formed large, or formed to have the same size as the connecting terminal 12 and the crimp connecting terminal 22. In that case, a jig for inspection (an inspection pad) which can connect the external connecting terminals 23a and 23b with the terminal 41a and the terminal 41b respectively may be used.

After the inspection setup is completed, resistance is measured by the inspection device 40. A resistance value R of a section as indicated by an arrow in the drawing is measured. Here, the measured value of resistance is the total value of the wire resistance of the inspection wire 24 of the flexible printed circuit 20, the connection resistance between the crimp inspection terminal 25 and the connecting terminal 12, the wire resistance of the connecting terminal 12, the connection resistance between the connecting terminal 12 and the crimp connecting terminal 22, and the wire resistance of the wiring 21 of the flexible printed circuit 20. Here, wire resistance is a specific value of resistance of a wire material, and is in proportion to a length. In addition, connection resistance is a resistance value which is generated in the boundary of two different wire materials. Resistance between the inspection device 40 and the terminal 41a, resistance between the inspection device 40 and a terminal 41b, resistance between the terminal 41a and the external connecting terminal 23a, and resistance between the terminal 41b and the external connecting terminal 23b are disregarded as being a sufficiently small resistance; however, in the case where these resistance cannot be disregarded, the measurement should be carried out in consideration of these resistance.

In many cases, each wire resistance of the wiring 21 and the inspection wire 24 over the flexible printed circuit 20 are 1 ohm or less, and the connection resistance of the crimp inspection terminal 25 and the connecting terminal 12 is several tens of ohms at the highest. In addition, although the wire resistance of the connecting terminal 12 depends on the material of the connecting terminal 12, the wire resistance can be reduced to about several ohms by narrowing an interval between the crimp connecting terminal 22 and the crimp inspection terminal 25. This is because the wire resistance is in proportion to a length.

Therefore, a factor which controls the value of resistance to be measured is only the connection resistance between the connecting terminal 12 and the crimp connecting terminal 22. The reference value can be decided from a desired value required for the connection resistance between the connecting terminal 12 and the crimp connecting terminal 22. When the measured value of resistance is less than the reference value, the electrical connecting state between the connecting terminal 12 and the crimp connecting terminal 22 can be determined to be good, and when the value of resistance is over the reference value, the electrical connecting state between the connecting terminal 12 and the crimp connecting terminal 22 can be determined to be defective in a simple and easy manner.

However, when a defect occurs at the connection between the crimp inspection terminal 25 and the connecting terminal 12, there is a possibility that the inspection cannot be performed. Therefore, the crimp inspection terminal 25 is preferably connected with the connecting terminal 12 surely. For example, a wide wiring may be used for the crimp inspection terminal 25. In addition, when a plurality of inspection wires 24 are prepared in the flexible printed circuit 20, probability in which the inspection cannot be performed can be reduced. This reason is because one inspection wire which would possibly have a connection defect can be replaced by the other inspection wire 24.

Subsequently, when the electrical connecting state between another connecting terminal 12 and the crimp connecting terminal 22 is inspected, the terminal 41b of the inspection device 40 is connected with the other external connecting terminal 23b, and resistance is measured. The inspection of the electrical connecting state between all of the connecting terminals 12 and the crimp connecting terminals 22 can be performed simply and easily by repeatedly changing the connection of the terminal 41b of the inspection device 40 and measuring the resistance.

When the electrical connecting state between the connecting terminals 12 and the crimp connecting terminals 22 are all determined to be good, the crimp inspection terminal 25 is removed in order to operate the semiconductor integrated circuit 11 for the circuit inspection or the like after the inspection. However, if the semiconductor integrated circuit 11 is not operated immediately, it is not necessary to remove the crimp inspection terminal 25 immediately. This is because since the crimp inspection terminal 25 connects all of the connecting terminals 12 to short them, the crimp inspection terminal 25 has an effect of prevention of electrostatic breakdown and can function as a protection circuit.

When the crimp inspection terminal 25 is removed, most part of the anisotropic conductive film 30 can be removed by using solvent. Here, cut areas 26 or an opening portion 27 for cutting are preferably formed in the flexible printed circuit in the position between the crimp connecting terminal 22 and the semiconductor integrated circuit 11 so as to make cutting easier. Then, a portion of the crimp inspection terminal 25 is removed from the connecting terminal 12 by using solvent; specifically, the crimp inspection terminal in the position between the cut area 26 and the semiconductor integrated circuit 11 is removed. A portion of the crimp inspection terminal 25 which is removed from the connecting terminal 12 can be cut at the cut area 26.

When the electrical connecting state between the connecting terminal 12 and the crimp inspection terminal 22 is determined to be defective, it is necessary to reattempt to connect the flexible printed circuit after the inspection. Thus, the flexible printed circuit 20 is removed from the substrate 10 by using solvent. Then, a thermocompression process is performed again, and the above inspection is performed.

Figure 4A:
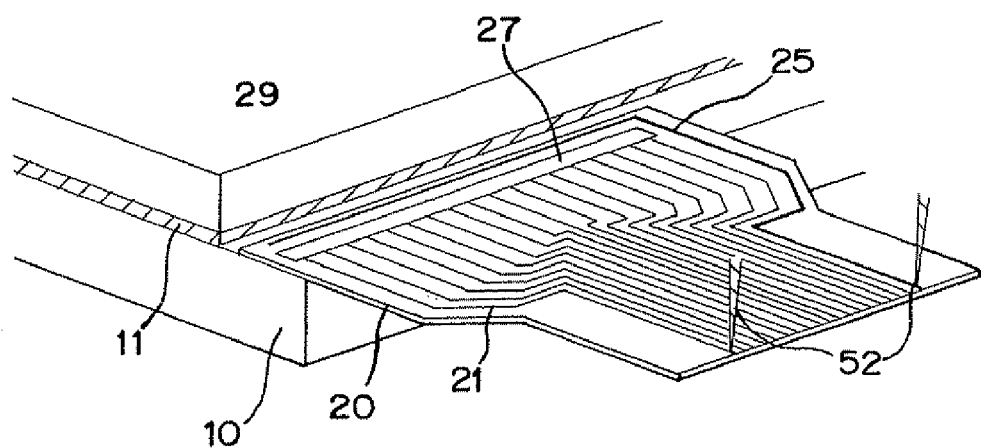
FIGS. 4A and 4B are perspective views each showing the inspection method of the present invention.

FIG. 4A is a perspective view showing the inspection of a connection state between the connecting terminal of the semiconductor integrated circuit 11 and the wire 21 of the flexible printed circuit 20 by using the inspection method of the present invention. The connecting terminal is not shown in FIG. 4A; however, the connecting terminal is provided between the semiconductor integrated circuit and the flexible printed circuit 20.

At least one crimp inspection terminal 25 is provided in the flexible printed circuit 20. One end of a probe 52 of the inspection device is fixed to the crimp inspection terminal 25, and the other end of the probe 52 is fixed sequentially to the wires 21, and the connecting state can be inspected.

When the inspection method of the present invention is applied, the opening portion 27 can be provided in one portion of the flexible printed circuit 20 for separating one portion of the flexible printed circuit after the inspection.

The inspection method of the present invention enables an inspection even after sealing the semiconductor integrated circuit with a counter substrate 29 or the like.

Figure 4B:
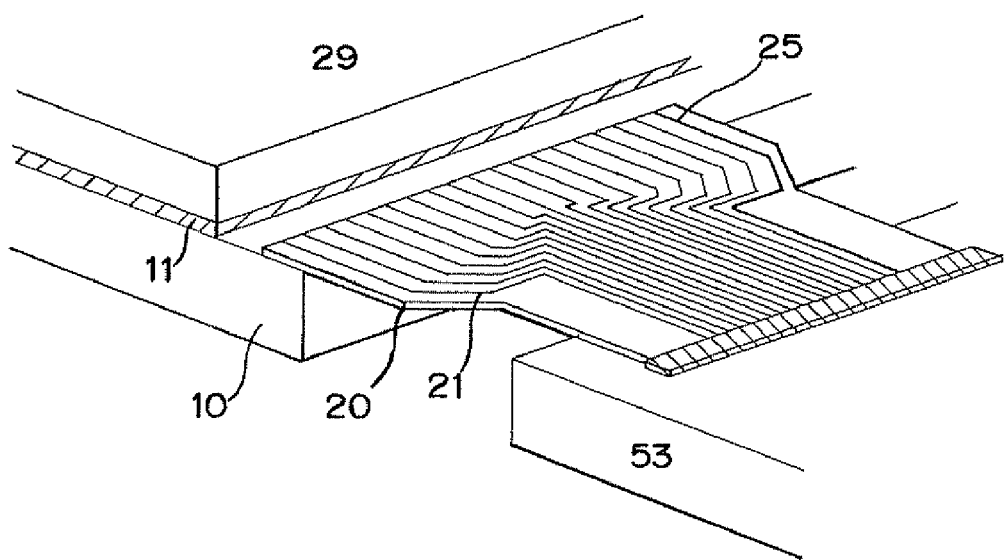

FIG. 4B shows a perspective view showing the connection state between the connecting terminal of the semiconductor integrated circuit 11 and the external device 53 through the wire 21 of the flexible printed circuit 20 after application of the inspection method of the present invention. In FIG. 4B, the connecting terminal is not shown.

According to this inspection method of the present invention, the inspection of the electrical connecting state between the connecting terminal of the semiconductor integrated circuit over the substrate and the crimp connecting terminal of the flexible printed circuit can be performed simply and easily. In addition, according to this inspection of the present invention, the inspection of the electrical connecting state between all of the terminals can be performed.

EMBODIMENT MODE 2

In this embodiment mode, an inspection method which is different from the above embodiment mode is described.

Figure 3:
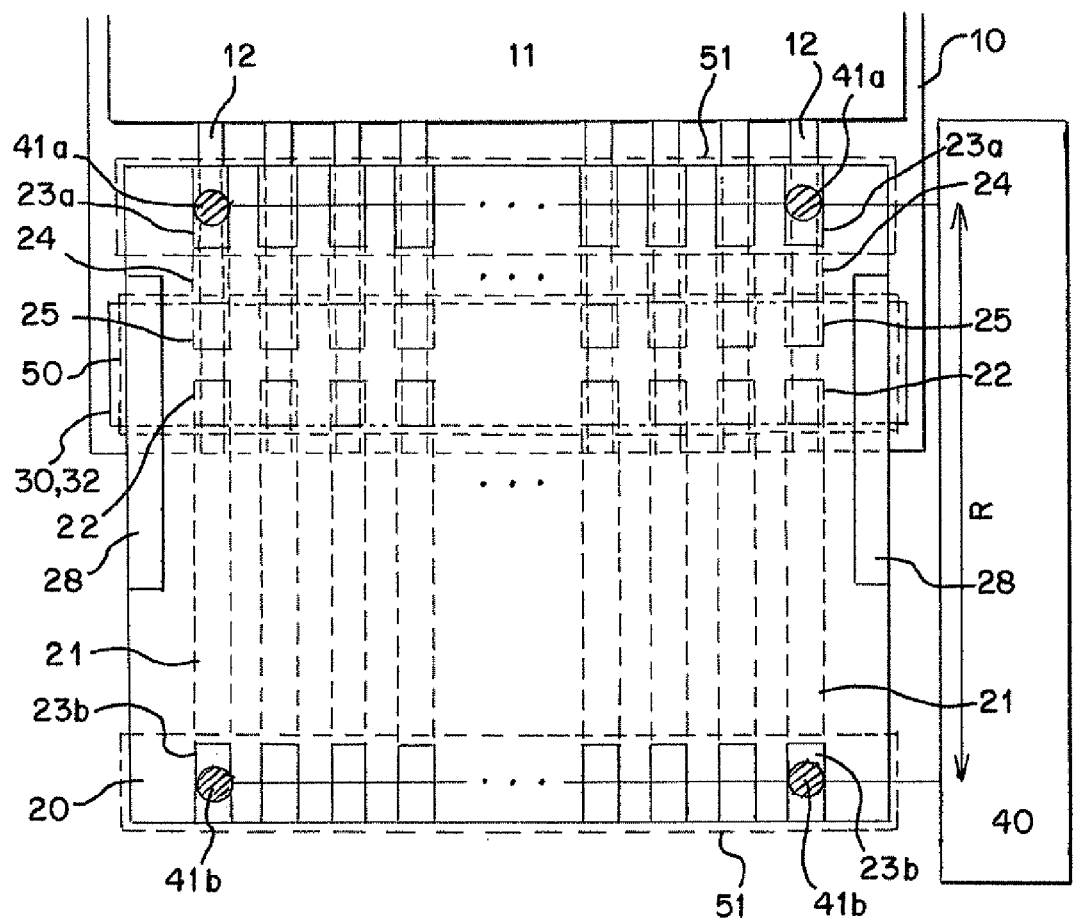
FIG. 3 is a top view showing a configuration of a connecting terminal of the present invention.

FIG. 3 shows an example in which the connecting terminal 12 of the semiconductor integrated circuit 11 formed over the substrate 10 is connected with the crimp connecting terminal 22 of the flexible printed circuit 20 through the anisotropic conductive film 30.

A configuration of FIG. 3 is similar to FIG. 1. What is different from FIG. 1 is that the inspection wires 24 of the flexible printed circuit 20 are provided independently of each other. In other words, FIG. 3 is different from FIG. 1 in that the inspection wires 24 are provided so as to be collinear with respect to the wires 21 respectively and are provided on the thermocompression region 32 (a region in which the anisotropic conductive layer is provided and to which thermocompression is performed) so that it extends to the side closer to the semiconductor integrated circuit 11. Note that after thermocompression, the inspection wires 24 are connected with the respective wires 21 through the anisotropic conductive film. Therefore, each of inspection wires 24 has a crimp inspection terminal 25 and external connecting terminal 23a. In addition, the crimp inspection terminal 25 can be formed with the same metal and the same shape as those of the crimp connecting terminal 22. In other words, the crimp inspection terminal 25 and the crimp connecting terminal 22 can be formed by performing patterning one conductive film.

In addition, reinforcing plates 28 may be attached to the flexible printed circuit 20 in order to retain the positional relation between the wires 21 and the inspection wires 24 in which the wires 21 are collinear with respect to the inspection wires 24 respectively. The reinforcing plates 28 can be attached to a back surface or a front surface of the flexible printed circuit 20. Alternatively, in substitution for the reinforcing plates, a wire material, that is, a metal can be formed in a similar position as reinforcement. Note that FIG. 3 shows a configuration in which the reinforcing plates 28 are attached to the front surface of the flexible printed circuit 20. In addition, in the region 50 where the crimp connecting terminals 22 and the crimp inspection terminals 25 is provided, the flexible printed circuit does not have an insulating layer on its back side (a side of the substrate 10). According to this configuration, the crimp connecting terminals 22 and the crimp inspection terminals 25 are exposed to the back side. Meanwhile, in the region 51 where the external connecting terminals 23a and the external connecting terminals 23b is provided, the flexible printed circuit 20 does not have the insulating layer on its front side. According to this configuration, the external connecting terminals 23a and the external connecting terminals 23b are exposed to a front side. In addition, the wires 21 and the inspection wires 24 is provided in a region which is sandwiched in the insulating layers except for the region 50 and a region 51. The structure of the flexible printed circuit is not limited to this structure.

As in Embodiment Mode 1, in thermocompression, the crimp connecting terminal 22 and the crimp inspection terminal 25 are connected with one of the connecting terminals 12 respectively.

After thermocompression, the electrical connecting state between the connecting terminal 12 and the crimp connecting terminal 22 is inspected. The electrical connecting state in the inspection can be determined to be a good state or a bad state in the same manner as Embodiment Mode 1, that is, by measuring a resistance value between the connecting terminal 12 and the crimp connecting terminal 22.

First, as the inspection setup, a terminal 41a of an inspection device 40 is fixed to the external connecting terminal 23a of the inspection wire 24, and another terminal 41b is connected with the external connecting terminal 23b which is collinear with respect to the external connecting terminal 23a connected with the terminal 41a.

After the inspection setup is completed, resistance is measured by the inspection device 40. A resistance value R of a section as indicated by an arrow in the drawing is measured. Here, the measured value of resistance is the total value of the wire resistance of the inspection wire 24 of the flexible printed circuit 20, the connection resistance between the crimp inspection terminal 25 and the connecting terminal 12, the wire resistance of the connecting terminal 12, the connection resistance between the connecting terminal 12 and the crimp connecting terminal 22, and the wire resistance of the wiring 21 of the flexible printed circuit 20. Resistance between the inspection device 40 and the terminal 41a, resistance between the inspection device 40 and the terminal 41b, resistance between the terminal 41a and the external connecting terminal 23a, and resistance between the terminal 41b and the external connecting terminal 23b are disregarded as being a sufficiently small resistance; however, in the case where these resistance cannot be disregarded, the measurement should be carried out in consideration of these resistance.

In many cases, each wire resistance of the wiring 21 and the inspection wire 24 over the flexible printed circuit 20 are 1 ohm or less. Since the wire resistance of the connecting terminal 12 is in proportion to a length, the wire resistance can be reduced by narrowing an interval between the crimp connecting terminal 22 and the crimp inspection terminal 25.

Here, this embodiment mode is different from Embodiment Mode 1 in the connection resistance between the crimp inspection terminal 25 and the connecting terminal 12. In the Embodiment Mode 1, the crimp inspection terminal 25 has been formed in a shape which would not easily cause a defect at the connection between the crimp inspection terminal 25 and the connecting terminal 12 in order to perform the inspection surely. However, in Embodiment Mode 2, the crimp inspection terminal 25 has the same shape as the crimp connecting terminal 22. Therefore, a factor which controls the value of resistance is the connection resistance between the crimp inspection terminal 25 and the connecting terminal 12, and the connection resistance between the connecting terminal 12 and the crimp connecting terminal 22, thus, the reference value is determined in consideration of the above factor. Since the connection between the crimp inspection terminal 25 and the connecting terminal 12 is included in an inspection object, the inspection will have severe conditions. However, since the crimp inspection terminal 25 and the crimp connecting terminal 22 are each formed to have the same width as the corresponding connecting terminal 12, in the case where a defect occurs, it is very likely that the defect occurs simultaneously. Therefore, the inspection which is equivalent to Embodiment Mode 1 is possible. When the measured value of resistance is less than the reference value, the electrical connecting state between the connecting terminal 12 and the crimp connecting terminal 22 can be determined to be good, and when measured value of resistance is over the reference value, one or both of the electrical connecting state between the connecting terminal 12 and the crimp connecting terminal 22, and the electrical connection state between the crimp inspection terminal 25 and the connecting terminal 12 can be determined to be defective.

Subsequently, when the electrical connecting state between another connecting terminal 12 and the crimp connecting terminal 22 is inspected, the terminals 41a and 41b of the inspection device 40 are connected with the other external connecting terminals 23a and 23b respectively, and resistance is measured. The inspection of the electrical connecting state between all of the connecting terminals 12 and the crimp connecting terminals 22 can be performed simply and easily by repeatedly changing the connection of the terminals 41a and 41b of the inspection device 40.

According to this inspection method of the present invention, the inspection of the electrical connecting state between the connecting terminal of the semiconductor integrated circuit over the substrate and the crimp connecting terminal of the flexible printed circuit can be performed simply and easily. In addition, according to this inspection of the present invention, the inspection of the electrical connecting state between all of the terminals can be performed.

EMBODIMENT MODE 3

In this embodiment mode, a display panel having a connecting terminal and a wire for performing the inspection of the present invention is described.

FIG. 5A shows a configuration of the display panel provided with a pixel portion 102, a signal line driver circuit 103, and a scanning line driver circuits 104 over a substrate 101 at the time of the inspection. The signal line driver circuit 103 is provided on a side of the substrate 101, and the scanning line driver circuits 104 are provided on two sides of the substrate 101 so as to sandwich the pixel portion 102. Flexible printed circuits 106 are provided on the signal line driver circuit 103 side, and a plurality of connecting terminals 105 are provided between the signal line driver circuit 103 and the flexible printed circuits 106. A signal from an external device can be inputted into the signal line driver circuit 103 or the scanning line driver circuits 104 through the connecting terminals 105. A display of the pixel portion 102 can be controlled by the inputted signal.

The inspection method shown in Embodiment Mode 1 or 2 can be applied to the inspection of a connecting state of the flexible printed circuits 106. Reference numeral 109 denotes a crimp connecting terminal in case of applying the inspection method shown in Embodiment Mode 1. Since the connecting state can be checked simply and easily by this inspection, mass productivity of a display panel can be improved. In addition, an opening portion 108 is provided in each of the flexible printed circuits 106 for applying the inspection method of the present invention.

In this embodiment mode, a liquid crystal display panel using a liquid crystal element, an EL display panel using an EL element, or other display panels can be applied to a display panel.

FIG. 5B shows a configuration in which the flexible printed circuits 106 are separated after the inspection. A display panel is formed with the flexible printed circuit 106 being separated, and a semiconductor device having the display panel can be manufactured.

Figure 6A:
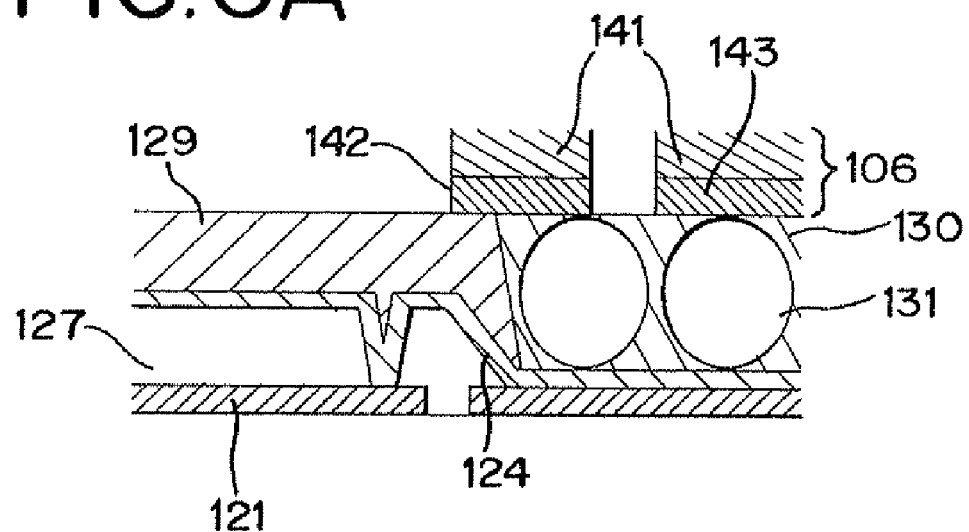
FIGS. 6A and 6B are views each showing a configuration of a connecting terminal of the present invention.

Next, a detailed sectional view of a case of using an EL display panel is described. FIG. 6A shows a sectional view of a region P shown in FIG. 5A. A first conductive film 121 is provided over a substrate 101 and can be used as a gate electrode of a transistor. The first conductive film 121 can be formed of an element which is selected from tantalum (Ta), tungsten (W), titanium (Ti), molybdenum (Mo), aluminum (Al), or copper (Cu), or an alloy material, or a chemical compound material based on the element.

An insulating film 127 is provided over the first conductive film 121. The insulating film 127 can be formed of an inorganic material or an organic material as well as an insulating film 129. The insulating film 127 can be used as an interlayer insulating film of a transistor.

The second conductive film 124 is provided over the insulating film 127. The second conductive film 124 can be used as a source electrode or a drain electrode of a transistor. The second conductive film 124 can be formed by using titanium (Ti), aluminum (Al), gold (Au), platinum (Pt), nickel (Ni), tungsten (W), chromium (Cr), molybdenum (Mo), iron (Fe), cobalt (Co), copper (Cu) palladium (Pd), or the like.

Note that the second conductive film 124 can be also used as a connecting terminal. Since the connecting terminal is leaded, in case that wire resistance of the second conductive film 124 is lower than that of the first conductive film 121, the second conductive film 124 may be used as the connecting terminal. In addition, a conductive film which can be used as an electrode of an EL element may be used as a connecting terminal. As a conductive film, a transmissive conductive film can be used, such as indium tin oxide (ITO), indium tin oxide including silicon oxide, or a conductive film formed by sputtering using a target of indium oxide containing silicon oxide mixed with a target containing zinc oxide (ZnO) within the range of 2 to 20 wt %.

The connecting terminals can be formed to have different width from each other. For example, a connecting terminal connected with an electrode of an EL element may be formed to be wide, and a connecting terminal connected with a signal line driver circuit or a scanning line driver circuit may be formed narrower than the above connecting terminal. An electrode of an EL element is formed very thin, and the wire resistance can be suppressed by using a wide connecting terminal.

The insulating film 129 is formed covering a portion of the second conductive film 124. The insulating film 129 can be formed of an inorganic material or an organic material. An organic material includes acrylic, polyimide, polyamide, and the like, and an inorganic material includes silicon oxide, silicon nitride oxide, and the like. In addition, in the pixel portion 102, the insulating film 129 can be used as a partition wall to separate adjacent EL elements.

The flexible printed circuit 106 has a crimp connecting terminal 143 and an insulating substance 141 covering the crimp connecting terminal 143. The crimp connecting terminal 143 can be formed of a metal which has low wire resistance. For example, copper (Cu) or aluminum (Al) can be used. Further, when copper is used, plating is preferably performed with nickel or the like in order to prevent diffusion of copper.

Then, an anisotropic conductive film 130 is provided over the second conductive film 124, and can be connected with the second conductive film 124 and the crimp connecting terminal 143. The anisotropic conductive film 130 includes a conductive particle 131, and the second conductive film 124 and the crimp connecting terminal 143 are connected through the conductive particle 131 by thermocompression. Accordingly, a display panel and the flexible printed circuit 106 are connected.

Thus, the connection state can be inspected by a crimp inspection terminal 142 provided in the flexible printed circuit 106.

Figure 6B:
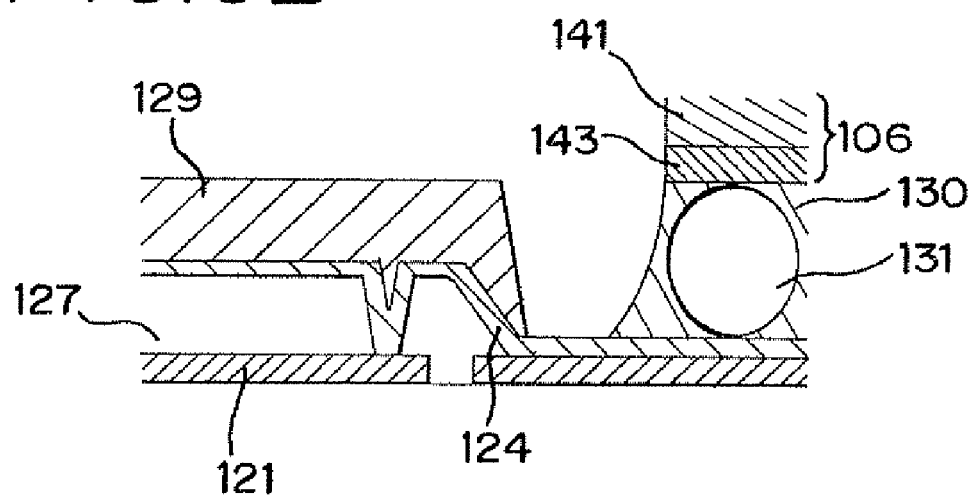

FIG. 6B shows a sectional view of the region P shown in FIG. 5B. After the inspection, a portion of the flexible printed circuit 106 is separated at the opening portion 108, and the display panel is formed as shown in FIG. 6B. When the flexible printed circuit 106 is separated at the opening portion 108, a portion of the anisotropic conductive film 130 is removed. In addition, after separating a portion of the flexible printed circuit, a region where the anisotropic conductive film 130 is removed may be filled with a resin material such as an epoxy resin which functions as a protective film. However, after separating a portion of the flexible printed circuit, a portion of the anisotropic conductive film 130 may be remained.

An EL panel which can be used in this embodiment mode is not limited to an organic EL panel. In the EL panel, when a luminescence material of the EL element is an organic compound, the EL panel is an organic EL panel, and when a luminescence material of the EL element is an inorganic compound, the EL panel is an inorganic EL panel; however, any kind of panels can be used as long as there is a connection between flexible printed circuit and a terminal. Needless to say, the luminescent material is not limited to an inorganic compound or an organic compound, and may be a mixed material of the inorganic material and the organic material.

Note that an inorganic EL element is classified into a dispersive inorganic EL element and a thin-film inorganic EL element depending on its element structure. The dispersive inorganic EL element has a light emitting layer in which a particle of the luminescent material is dispersed in a binder. The thin-film inorganic EL element has a light emitting layer formed of a thin film of a fluorescent material. The light emitting mechanism of both the elements is such that light emission can be obtained by collision excitation of a light emission center in the light emitting layer and an electron which is accelerated in high electrical field. When the inorganic EL element is formed, an insulating layer in which a luminescent material is dispersed is preferably provided as an EL layer between a pixel electrode and an electrode, or a light emitting layer sandwiched by insulating layers is preferable provided between a pixel electrode and an electrode. For example, zinc sulfide (ZnS), strontium sulfide (SrS), or the like can be used as a luminescent material. An EL layer of an inorganic EL element can be formed by screen printing or vapor deposition or the like.

This embodiment mode is described using the display panel in which the driver circuits such as the signal line driver circuit and the scanning line driver circuit are formed over the substrate 101. The inspection method of the present invention can be applied without limiting to such a display panel. In other words, any kind of displays can be applied as long as there is a connection between a flexible printed circuit and a terminal.

EMBODIMENT MODE 4

An electronics device using the inspection method of the present invention can be manufactured. An electronics device includes: a television set (simply referred to as a TV, or a television receiver), a digital camera, a digital video camera, a mobile phone (simply referred to as a cellular phone set, or a cellular phone), a portable information terminal such as PDA, a portable game machine, a monitor for a computer, a computer, a sound reproducing device such as a car audio set, an image reproducing device provided with a recording medium reading portion such as a home game machine, and the like. Specific examples thereof are described with reference to FIGS. 7A to 7F.

Figure 7A:
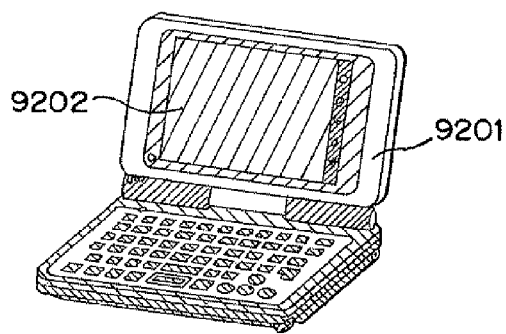
FIGS. 7A to 7F are views showing electronics devices of the present invention.

A portable information terminal shown in FIG. 7A includes a main body 9201, a display portion 9202, and the like. The display panel manufactured by using the inspection method of the present invention can be applied to the display portion 9202. Accordingly, the inspection of the connecting state of wire over a flexible printed circuit can be made simple and easy. According to the inspection method of the present invention, the mass productivity can be enhanced, which leads to the cost reduction of the portable information terminal.

Figure 7B:
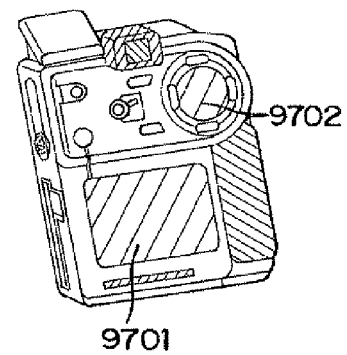

A digital video camera shown in FIG. 7B includes a display portion 9701, a display portion 9702, and the like. The display panel manufactured by using the inspection method of the present invention can be applied to the display portion 9701 and the display portion 9702. Accordingly, the inspection of the connecting state of wire over a flexible printed circuit can be made simple and easy. According to the inspection method of the present invention, the mass productivity can be enhanced, which leads to the cost reduction of the digital video camera.

Figure 7C:
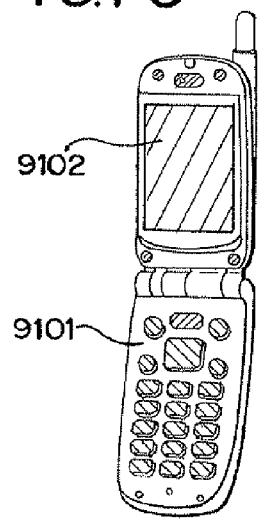

A cellular phone shown in FIG. 7C includes a main body 9101, a display portion 9102, and the like. The display panel manufactured by using the inspection method of the present invention can be applied to the display portion 9102. Accordingly, the inspection of the connecting state of wire over a flexible printed circuit can be made simple and easy. According to the inspection method of the present invention, the mass productivity can be enhanced, which leads to the cost reduction of the cellular phone.

Figure 7D:
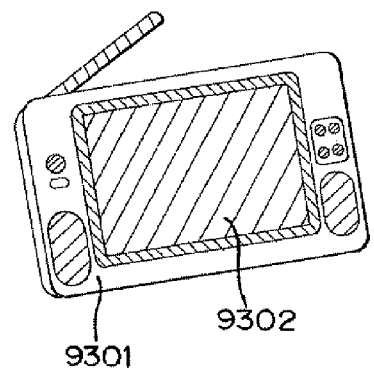

A portable television set shown in FIG. 7D includes a main body 9301, a display portion 9302, and the like. The display panel manufactured by using the inspection method of the present invention can be applied to the display portion 9302. Accordingly, the inspection of the connecting state of wire over a flexible printed circuit can be made simple and easy. According to the inspection method of the present invention, the mass productivity can be enhanced, which leads to the cost reduction of the portable television set. The display panel manufactured by using the inspection method of the present invention can be applied to various types of television sets such as a small-sized television set which is incorporated into a portable terminal such as a cellular phone, a medium-sized television set which is portable, and a large-sized television set (for example, 40 inches in size or more).

Figure 7E:
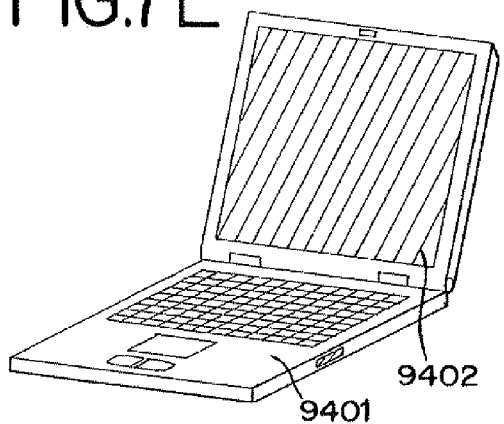

A computer shown in FIG. 7E includes a main body 9401, a display portion 9402, and the like. The display panel manufactured by using the inspection method of the present invention can be applied to the display portion 9402. Accordingly, the inspection of the connecting state of wire over a flexible printed circuit can be made simple and easy. According to the inspection method of the present invention, the mass productivity can be enhanced, which leads to the cost reduction of the computer.

Figure 7F:
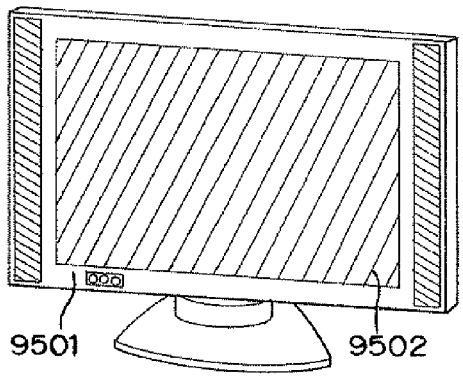

A television set shown in FIG. 7F includes a main body 9501, a display portion 9502, and the like. The display panel manufactured by using the inspection method of the present invention can be applied to the display portion 9502. Accordingly, the inspection of the connecting state of wire over a flexible printed circuit can be made simple and easy. According to the inspection method of the present invention, the mass productivity can be enhanced, which leads to the cost reduction of the television set.

According to such an inspection method of the present invention which can inspect the connecting state simply and easily, the mass productivity can be enhanced, which leads to the cost reduction of an electronics device.

This application is based on Japanese Patent Application serial No. 2005-133494 filed in Japan Patent Office on Apr. 28, 2005, the entire contents of which are hereby incorporated by reference.

What is claimed is:

1. A semiconductor device comprising:
   a connecting terminal provided in a semiconductor integrated circuit; and
   a flexible printed circuit comprising a crimp connecting terminal and a crimp inspection terminal, each of which is connected with the connecting terminal,
   wherein the crimp inspection terminal is provided over the connecting terminal and between the flexible printed circuit and the connecting terminal, and
   wherein the flexible printed circuit comprises an opening portion between the crimp connecting terminal and the crimp inspection terminal.

2. The semiconductor device according to claim 1, wherein the connecting terminal and the crimp connecting terminal are connected by an anisotropic conductive film.

3. The semiconductor device according to claim 1 further comprising an external circuit which is connected with the semiconductor integrated circuit through the crimp connecting terminal.

4. The semiconductor device according to claim 1, wherein the crimp inspection terminal is longer than the crimp connecting terminal.

5. The semiconductor device according to claim 1, wherein the crimp inspection terminal is formed to have a right angle.

6. The semiconductor device according to claim 1, wherein the crimp inspection terminal provided over the connecting terminal is between the opening and the semiconductor integrated circuit.

7. A semiconductor device comprising:
   a connecting terminal provided in a semiconductor integrated circuit; and
   a flexible printed circuit comprising a crimp connecting terminal and a crimp inspection terminal, each of which is connected with the connecting terminal,
   wherein the crimp inspection terminal is provided in an inspection wire of the flexible printed circuit,
   wherein the crimp inspection terminal is provided over the connecting terminal and between the flexible printed circuit and the connecting terminal, and wherein the flexible printed circuit comprises an opening portion between the crimp connecting terminal and the crimp inspection terminal.

8. The semiconductor device according to claim 7, wherein the connecting terminal and the crimp connecting terminal are connected by an anisotropic conductive film.

9. The semiconductor device according to claim 7 further comprising an external circuit which is connected with the semiconductor integrated circuit through the crimp connecting terminal.

10. The semiconductor device according to claim 7, wherein the crimp inspection terminal is longer than the crimp connecting terminal.

11. The semiconductor device according to claim 7, wherein the crimp inspection terminal is formed to have a right angle.

12. The semiconductor device according to claim 7, wherein the crimp inspection terminal provided over the connecting terminal is between the opening and the semiconductor integrated circuit.

13. A semiconductor device comprising:
a connecting terminal provided in a semiconductor integrated circuit; and
a flexible printed circuit comprising a crimp connecting terminal and a crimp inspection terminal, each of which is connected with the connecting terminal,
wherein the crimp inspection terminal is provided in an inspection wire of the flexible printed circuit;
wherein the crimp inspection terminal is provided over the connecting terminal and between the flexible printed circuit and the connecting terminal, and
wherein an opening portion is provided in the flexible printed circuit between the crimp connecting terminal and the crimp inspection terminal in a thermocompression region capable of connecting the connecting terminal with the crimp connecting terminal.

14. The semiconductor device according to claim 13, wherein the connecting terminal and the crimp connecting terminal are connected by an anisotropic conductive film.

15. The semiconductor device according to claim 13 further comprising an external circuit which is connected with the semiconductor integrated circuit through the crimp connecting terminal.

16. The semiconductor device according to claim 13, wherein the crimp inspection terminal is longer than the crimp connecting terminal.

17. The semiconductor device according to claim 13, wherein the crimp inspection terminal is formed to have a right angle.

18. The semiconductor device according to claim 13, wherein the crimp inspection terminal provided over the connecting terminal is between the opening and the semiconductor integrated circuit.

19. A semiconductor device comprising:
a semiconductor integrated circuit comprising a plurality of connecting terminals; and
a flexible printed circuit comprising the same number of wires as the connecting terminals and an inspection wire;
wherein each of the wires comprises a crimp connecting terminal and a first external connecting terminal;
wherein the inspection wire comprises a crimp inspection terminal and a second external connecting terminal;
wherein each of the plurality of connecting terminals is connected with the crimp connecting terminal of the corresponding wire;
wherein each of the plurality of connecting terminals is connected with the crimp inspection terminal of the inspection wire; and
wherein the flexible printed circuit comprises an opening portion between the crimp connecting terminal and the crimp inspection terminal.

20. The semiconductor device according to claim 19, wherein the connecting terminal and the crimp connecting terminal are connected by an anisotropic conductive film.

21. The semiconductor device according to claim 19 further comprising an external circuit which is connected with the semiconductor integrated circuit through the crimp connecting terminal.

22. The semiconductor device according to claim 19, wherein the crimp inspection terminal is longer than the crimp connecting terminal.

23. The semiconductor device according to claim 19, wherein the crimp inspection terminal is formed to have a right angle.

24. The semiconductor device according to claim 19, wherein the crimp inspection terminal provided over each of the connecting terminals is between the opening and the semiconductor integrated circuit.

* * * * *